United States Patent

Myers, Jr. et al.

[11] Patent Number: 5,840,590
[45] Date of Patent: Nov. 24, 1998

[54] IMPURITY GETTERING IN SILICON USING CAVITIES FORMED BY HELIUM IMPLANTATION AND ANNEALING

[75] Inventors: Samuel M. Myers, Jr.; Dawn M. Bishop; David M. Follstaedt, all of Albuquerque, N. Mex.

[73] Assignee: Sandia Corporation, Albuquerque, N. Mex.

[21] Appl. No.: 160,704

[22] Filed: Dec. 1, 1993

[51] Int. Cl.$^6$ .................................................. H01L 21/306
[52] U.S. Cl. ...................... 437/11; 437/24; 148/DIG. 24
[58] Field of Search .................. 437/10, 11, 24, 437/247, 927; 148/DIG. 24, DIG. 60, DIG. 73

[56] References Cited

U.S. PATENT DOCUMENTS

| | | | |
|---|---|---|---|
| 3,874,936 | 4/1975 | d'Hervilly et al. ........................ | 437/11 |
| 4,069,068 | 1/1978 | Beyer et al. .............................. | 437/11 |
| 4,956,693 | 9/1990 | Sawahata et al. ....................... | 257/590 |

Primary Examiner—Chandra Chaudhari
Attorney, Agent, or Firm—George H. Libman

[57] ABSTRACT

Impurity gettering in silicon wafers is achieved by a new process consisting of helium ion implantation followed by annealing. This treatment creates cavities whose internal surfaces are highly chemically reactive due to the presence of numerous silicon dangling bonds. For two representative transition-metal impurities, copper and nickel, the binding energies at cavities were demonstrated to be larger than the binding energies in precipitates of metal silicide, which constitutes the basis of most current impurity gettering. As a result the residual concentration of such impurities after cavity gettering is smaller by several orders of magnitude than after precipitation gettering. Additionally, cavity gettering is effective regardless of the starting impurity concentration in the wafer, whereas precipitation gettering ceases when the impurity concentration reaches a characteristic solubility determined by the equilibrium phase diagram of the silicon-metal system. The strong cavity gettering was shown to induce dissolution of metal-silicide particles from the opposite side of a wafer.

19 Claims, 4 Drawing Sheets

IMPURITY GETTERING IN SILICON USING CAVITIES FORMED BY HELIUM IMPLANTATION AND ANNEALING

The United States Government has rights in this invention pursuant to Contract No. DE-AC04-76DP00789 between the Department of Energy and American Telephone and Telegraph Company.

BACKGROUND OF THE INVENTION

This invention relates to the field of microelectronics. More specifically this invention relates to the field of semiconductor wafer fabrication processes.

DESCRIPTION OF PRIOR ART

The electrical properties of silicon semiconductor devices are detrimentally affected by very low concentrations of metallic impurities in the silicon, especially transition-metal impurities. Transition-metal impurities are particularly undesirable because of the mobility of the contaminant atoms within the substrate silicon. Concentrations that can affect device performance are so low, that total removal of the impurities from the bulk silicon is not practical.

The semiconductor industry solution to dealing with mobile transition-metal contaminants in addition to stringent clean room procedures, has been the use of a gettering processing step in device fabrication that collects and immobilizes the impurity, during heating, in a sacrificial region within the bulk silicon. Even though the gettered impurities are still present in the silicon, device performance will not be impacted if they are trapped and immobilized in a region removed from the electronically active areas on the wafer.

Currently the principal method of gettering is to induce nucleation of metal-silicide precipitates which then grow by accumulating additional metal atoms during annealing at a temperature where they are mobile. Silicide nucleation can be achieved by several techniques used for the introduction of defects or impurities into the silicon. Those techniques have included mechanical damage, polysilicon chemical vapor deposition, ion implantation and diffusion of dopants from the surface into the bulk of the silicon.

An important limitation of these techniques is that the reduction in impurity concentration is limited to the solid solubility of the impurity in silicon as given by the equilibrium phase diagram. Another limitation of the current processes is the inability to use silicide gettering in the sacrificial region to reverse the effects of unwanted silicide precipitation in a critical device active region of the wafer.

The present invention overcomes the limitations associated with current gettering technology by providing a high concentration of high energy bonding sites for the metal impurities which will remove metal contaminate atoms to a substantially lower concentration that the equilibrium solid solubility and will dissolve unwanted silicide precipitates from critical regions of the wafer.

It has been found that cavities can be generated within bulk silicon by ion implantation of helium atoms into the near surface region followed by an annealing step for cavity enlargement. It has been further found that the internal surfaces of the cavities, so generated, are populated with dangling silicon bonds that protrude unobstructed into the interior of the cavity. It has been further found that the dangling silicon bonds react strongly with transition metal impurities resulting in their immobilization. Further it has been found that the strength of the dangling-bond reaction is high enough to provide gettering substantially superior to what is currently achieved by silicide precipitation. Further it has been found that the cavities remain structurally stable within the silicon over the range of temperatures employed for device processing.

SUMMARY OF THE INVENTION

The present invention relates to the removal of transition-metal impurities in semiconductor grade silicon using implanted helium atoms to generate cavities within the silicon lattice. The interior walls of the cavities created, according to the invention, contain a high density of dangling silicon bonds that exhibit a high affinity for transition-metal contaminates that are a leading cause of silicon device malfunction or failure in the semiconductor industry. Binding energies between the dangling bonds and contaminate atoms have been measured to be higher than the binding force immobilizing contaminates in conventional gettering techniques based on metal-silicide precipitation. This greater binding reduces the concentration of metal impurities in solution in the silicon wafer to a substantially lower level and it provides the capability to dissolve metal-silicide precipitates that have formed at undesirable locations. Cavity traps that result from the inventive process also retain their structural integrity to at least 1180° C., making their use compatible with established manufacturing practices. The process also has the advantage of being reproducible on standard semiconductor processing equipment currently commercially available and the ability to provide gettering protection to semiconductor devices without the introduction of chemically or electrically active foreign elements into the silicon substrate.

An object of the invention is to provide a process to achieve gettering of contaminate atoms in semiconductor substrate materials.

A further object of the invention is to provide a process for immobilization of contaminate atoms in semiconductor materials without the use of residual chemically or electrically active foreign elements in the substrate.

A still further object of the invention is to provide a process for gettering of contaminate atoms in semiconductor materials where said gettering remains effective to arbitrarily small metal impurity concentrations, including concentrations below the solid solubility of the impurity atoms.

A still further object of the invention is to provide a gettering process with sufficient binding force to immobilize contaminate atoms through subsequent semiconductor processing steps at elevated temperatures.

A still further object of the invention is to provide a process for semiconductor contaminate gettering capable of being carried out using existing semiconductor equipment technology and systems.

A still further object of the invention is to provide a gettered crystalline wafer for microelectronics manufacture having impurities levels substantially below the solubility of the impurities therein.

Additional objects, advantages and novel features of the invention will become apparent to those skilled in the art upon examination of the following description or may be learned by practice of the invention. The objects and advantages of the invention may be realized and attained by means of the processes particularly pointed out in the appended claims.

To achieve the foregoing and other objects, and in accordance with the purpose of the present invention, as embodied and broadly described herein, the present invention comprises a Process for gettering an impurity-containing crystalline substrate for the manufacture of semiconductor devices comprising: (A) ion-implanting an inert gas into a surface of the crystalline substrate to form gettering cavities with wall surfaces therein; (B) heating said ion-implanted substrate to an annealing temperature; and (C) annealing the ion-implanted substrate to enlarge the gettering cavities therein and to promote migration of the impurities within the bulk of said crystalline substrate to said gettering cavities; whereby metal impurities such as copper atoms are trapped at the wall surfaces of the gettering cavities by means of association with dangling chemical bonds of said crystalline material located at said wall surfaces.

BRIEF DESCRIPTION OF THE DRAWINGS

The accompanying picture and graphs, which are incorporated in and form part of the specification, further illustrate the present invention and, together with the description, serve to explain the principles of the invention.

DETAILED DESCRIPTION OF THE INVENTION

Figure 1:
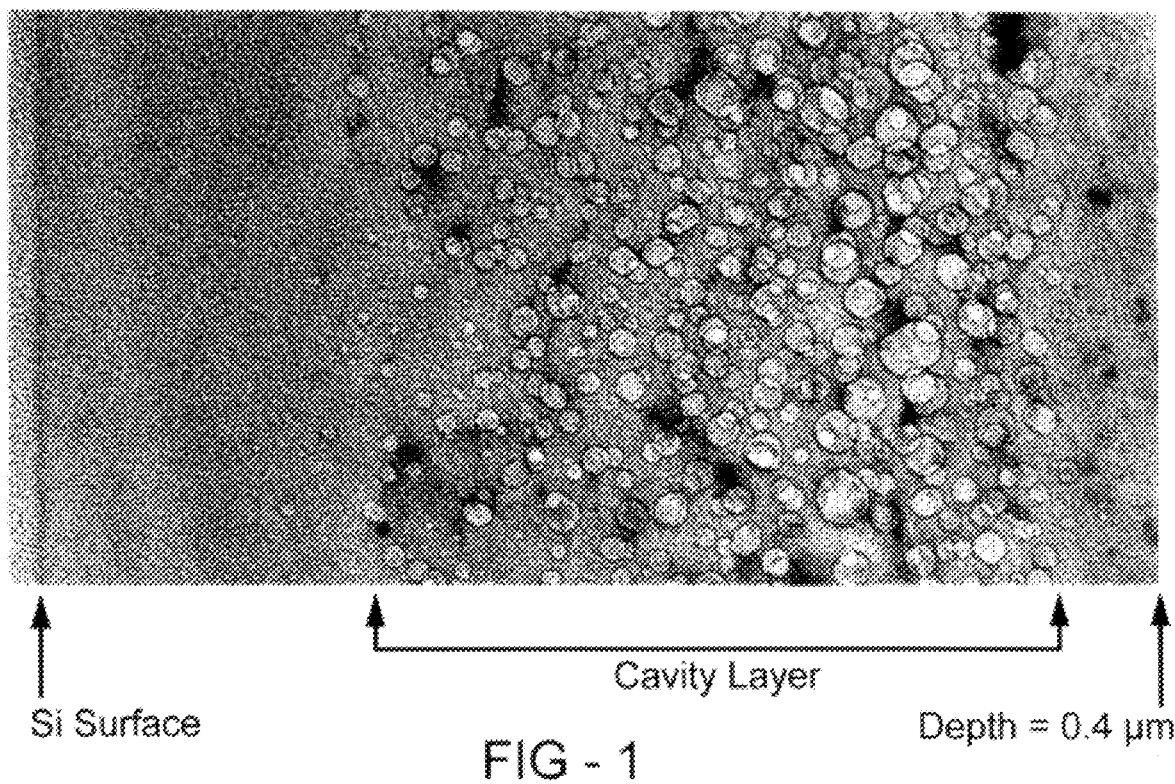
FIG. 1 is a cross section transmission electron micrograph showing the microscopic voids within silicon resulting from the inventive process.

The present invention provides a method for silicon wafer impurity gettering using closed microscopic cavities within the silicon bulk. The subject inventive process is an alternative to using metal-silicide precipitation as a means to immobilize transition-metal contaminants that adversely impact device performance. The subject process is specifically distinguished from current gettering technology through the new concept of using highly reactive cavity walls formed by helium ion implantation and annealing to bind metal impurity atoms. This results in a larger binding energy than is available through conventional methods based on metal silicide precipitation. Furthermore, the fundamental cavity binding mechanism is based on attachment of metal atoms to fixed, pre-existing dangling-bond traps instead of continuous growth of metal-silicide precipitates. Because of this distinguishing feature, the cavity gettering centers attract metal impurities regardless of the impurity concentration, in contrast to precipitation gettering. These features are further discussed below.

The implementation of the subject invention is envisioned as proceeding as follows. Cavities are first formed in a region of the silicon wafer that is spatially removed from the zone containing the devices. Then, the wafer is subjected to a heat treatment sufficient to mobilize the impurity atoms and cause their diffusion to the cavity traps. The time and temperature required for this heat treatment can be calculated based on the known dimensions of the wafer and the published diffusion rates and solid solubilities of the impurities to be gettered. Examples of such gettering and extensions of the methodology are described elsewhere in this document.

Immobilization of contaminant atoms by cavity trapping has several advantages over current immobilization by precipitation techniques. Gettering processes that rely upon precipitation and phase changes within the silicon-contaminate system, can only reduce impurity concentrations, in the silicon bulk, down to a solid solubility determined by the silicon-impurity equilibrium phase diagram. This property is known from well established and generally accepted principles of thermodynamics. Once the equilibrium solid solubility concentration is reached in the silicon bulk, atoms removed through precipitation will be matched by an equal number of impurity atoms re-dissolving out of the precipitate phase, back into the bulk.

The removal of impurity atoms by cavity trapping, as disclosed in the subject invention, does not cease when the impurity concentration decreases to the equilibrium solubility. Instead, as a result of the fundamentally different nature of trapping as compared to precipitation, the cavities will getter a large, fixed fraction of the impurity atoms even when the pre-gettering impurity concentration in the wafer is vanishingly small.

In addition to not being limited by the solid solubility limit, the subject invention provides a much higher bonding energy between the cavity trap and contaminant than is found for contaminate atoms in the precipitated metal-silicide phase of the solid solution. Additional desirable features of cavity gettering include the thermal stability of the cavities up to temperatures as high as 1180° C.

It was confirmed that a high density of cavities can be formed in silicon by ion-implanting helium at room temperature followed by vacuum annealing the silicon at a temperature of 700° C. or higher. The ion-implantation step forces the helium atoms into the silicon lattice as un-reactive gaseous bubbles. The elevated temperatures of the annealing step cause the helium to permeate from the silicon and leave behind empty cavities in the crystalline lattice.

It was further discovered that the internal surface of a cavity is terminated by large numbers of chemically reactive silicon dangling bonds which protrude unobstructed into the closed microscopic void. The resulting number of internal-surface dangling bonds can readily be made to exceed $1 \times 10^{15}$ per $cm^2$ of wafer area, which is several orders of magnitude greater than the impurity levels that arise in semiconductor processing. Hence, the saturation of cavity trap sites with metal atoms is not an important limitation on the application of the cavity gettering process.

The ion-implantation procedure used in the subject inventive process to inject helium atoms closely parallels the ion-implantation processing steps used commercially to inject electrical dopants. Gaseous helium is fed into an ion source where the atoms become positively ionized. The ions are then accelerated in an electrostatic field produced by high voltage, passed through a magnetic filter to remove impurities, and finally directed onto the wafer. The acceleration voltage of 30 kV that was used in most of the experiments reported here injects the helium to a depth of about 0.3 $\mu$m within the silicon, producing the cavity layer shown in FIG. 1. This depth can be increased or reduced as needed in device processing by changing the acceleration voltage. The resulting helium-implanted wafers are then ready for the high temperature annealing phase of the inventive process.

Cavity gettering is expected to be effective not only for copper and nickel impurities, where the process has been experimentally demonstrated, but also for the other transition-metal impurities. Furthermore, because the formation of cavities during helium ion implantation is believed to result from the chemical inertness of the helium, implantation of the other inert gasses neon, argon, krypton and xenon is expected also to produce cavities with favorable impurity-gettering properties. Furthermore, cavities are observed to be present immediately after helium implantation at room temperature, before the high-temperature anneal that produces enlargement and release of the helium; therefore, effective gettering may not require the high-temperature anneal. The annealing step can also, be accomplished as part of a subsequent process step in the manufacture of the semiconductor chip final product as an alternative to providing a separate annealing step after ion implantation. Furthermore, since the presence of dangling bonds is a general phenomenon for bare semiconductor surfaces that have not been exposed to air, cavity gettering of impurities may also prove effective in germanium, in silicon-germanium alloys, and in type III-V and type II-VI compound semiconductors.

The size of the gettering cavities obtained is normally within the range of from 5 to 30 nm in diameter, the size depending chiefly on anneal conditions, size tending to increase with higher anneal temperatures. The gettering capacity of the cavities is dependent on total cavity wall surface area, rather than on the size of individual cavities.

The preferred range of annealing temperatures is from about 700° C. up to as high as 1180° C., with a time duration of from about 30 minutes to about one hour. The anneal temperature is selected according to the particular impurity to be removed and should be high enough to mobilize that particular impurity. The anneal time is selected according to the known diffusion rate of the impurity to be gettered and the distance the impurity must necessarily migrate to reach the gettering cavities. Anneal time is also dependent upon whether the impurity is present as a precipitate, or in solution.

The ion implant dose is preferably in the range of $2 \times 10^{16}$ atoms to $1 \times 10^{17}$ atoms per $cm^2$. Below this range, the number of cavities formed falls off dramatically. Doses above this range tend to be unnecessary to obtain desired gettering capability in the silicon substrate.

Ion implant energies employed for silicon are preferably in the range of 30 keV to 300 keV, well within the capability of ion implant devices presently used commercially in the microelectronics industry. In silicon, ion implant energies of 30 keV result in a layer of cavity-containing material at a depth of about 0.3 $\mu$m. At 300 keV ion implant energies in silicon, a layer of cavity-containing material is obtained at a depth of about 1.3 $\mu$m. For wafer backside gettering, a lower implant energy and resulting lesser depth is normally sufficient. Desired depth can depend upon desired migration distance from the electronic devices to be built on the wafer front side. Front side gettering processes, such as those for insulation-backed silicon wafers, can effectively employ higher ion implant energies to obtain deeper cavity layers and thus allow for the building of electronic devices at the wafer surface. If desired, an overlayer can be epitaxially grown on the front side after ion implantation for additional material depth if required to build the electronic devices.

The following examples further illustrate the present invention.

EXAMPLES

Experiments where copper and nickel were introduced as contaminates into the processed silicon, revealed that the strength of the dangling-bond reaction with the contaminate is high enough to provide gettering substantially superior to what is currently achieved by silicide precipitation. The binding energy for the copper contaminants was measured to be 2.2 eV as compared to the binding energy in a copper-silicide precipitate which has been determined to be 1.7 eV. This difference in bonding energy equates to several orders of magnitude more reduction of impurity concentration for any given temperature when comparing cavity gettering to silicide precipitation.

FIG. 1 shows a cross-section transmission-electron micrograph of cavities within silicon following room-temperature ion-implantation of $1 \times 10^{17}$ He atoms/$cm^2$ at an energy of 30 keV and subsequent vacuum annealing for 30 minutes at 700° C. The bright field image of FIG. 1 was taken at slight under-focus, causing the cavities to appear light with dark borders. Although the implantation dose used for the sample in FIG. 1 was $1 \times 10^{17}$ He atoms/$cm^2$, beneficial gettering effects have also been achieved with implantation dosages as low as $2 \times 10^{16}$ which reduces the cost of implementation for the inventive process step.

Because the impurity metal atoms are bound to cavity-wall dangling bonds, the maximum number of trapped atoms is governed by the interior surface area of the closed cavities. Transmission electron micrographs such as FIG. 1 were used to calculate the amount of internal surface area per unit wafer area. The microstructure of FIG. 1 is representative, and in this case the result is 7 $cm^2$ of internal surface per $cm^2$ of wafer. Multiplying this number by the density of dangling bonds on the cavity walls, about $7 \times 10^{15}$ per $cm^2$ of wall area, then gives an estimate of the number of impurity atoms that can be trapped. The product is $4.9 \times 10^{15}$ atoms/$cm^2$, in close agreement with the saturation level seen in FIG. 2. This saturation level is several orders of magnitude greater than the impurity levels that are of practical interest in semiconductor processing.

Figure 2:
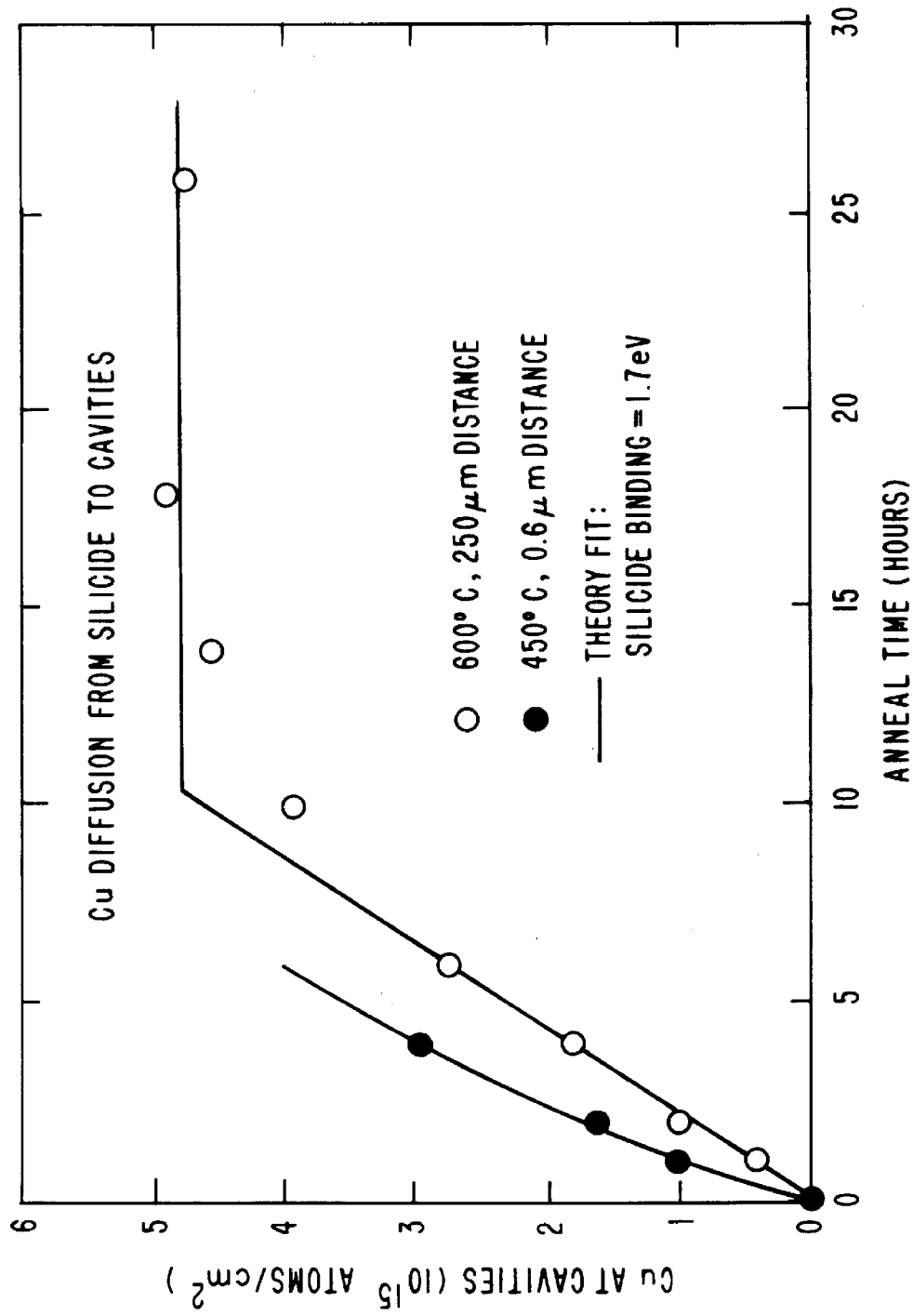
FIG. 2 is a graph showing the accumulation of copper atoms in cavity traps during annealing, the copper being supplied by the dissolution of copper silicide precipitates in a separate layer.
Figure 3:
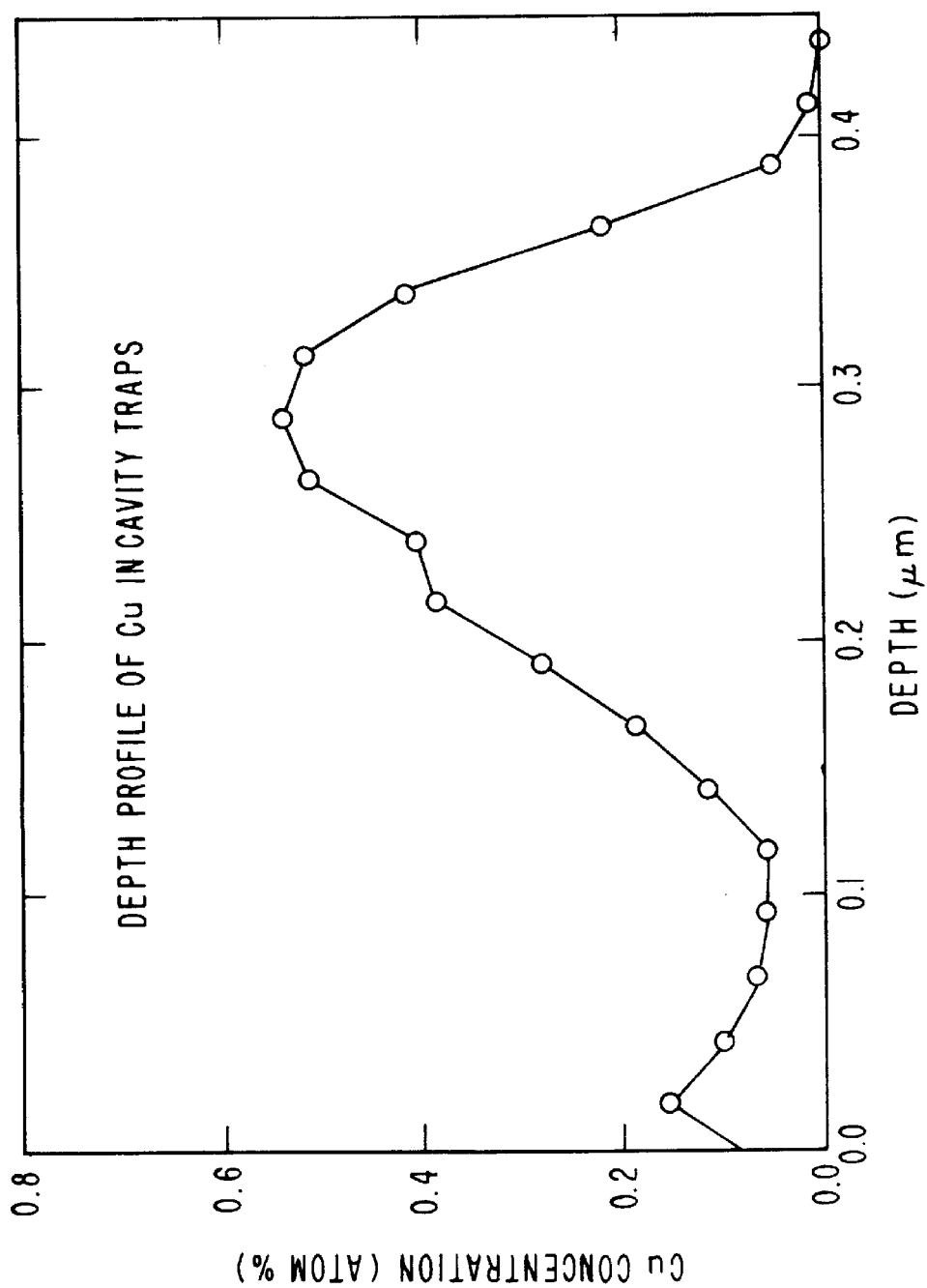
FIG. 3 is a graph of the depth distribution of gettered copper atoms on the side of a silicon wafer containing a layer of cavities.

FIG. 2 shows experimental data which directly demonstrates gettering of copper from precipitated copper silicide on one side of a silicon wafer to cavity traps on the opposite side. These data are plotted as open circles. In this demonstration the initial step was to use the subject inventive process to form the gettering cavities. The procedure was identical to that discussed in connection with FIG. 1, above. Copper was then implanted on the opposite side of the wafer using an implantation energy of 150 keV and an implantation dosage of $1 \times 10^{17}$ atoms per square centimeter. The implantation was followed by vacuum annealing at 600° C., and the accumulation of copper in the cavity traps was measured using Rutherford backscattering spectrometry (RBS). The data show that copper migrated through the 250 $\mu$m thickness of the wafer to the cavities until the trapping sites were saturated, whereupon the migration stopped. Measurements of the amount of copper at which the trapping sites became saturated agreed with the calculation for density of the internal-surface dangling bonds that was a product of the TEM image analysis.

FIG. 2 also shows the gettering of copper from copper silicide located on the same side of the wafer as the cavities at the much smaller distance of 0.6 $\mu$m, as observed for the lower annealing temperature of 450° C. These data are plotted as filled circles. The measurement of the dissolution rate for the copper silicide at the two temperatures of 450° C. and 600° C. permits the binding energy of copper atoms in the silicide to be calculated, giving 1.7 eV relative to copper in solution in the silicon lattice. This result agrees with the published copper-silicide phase diagram.

The results depicted in FIG. 2 are shown for two annealing temperatures and the two distances between the cavity layer and the silicide layer. Saturation of the cavity traps occurs at $5 \times 10^{15}$ copper atoms/cm$^2$, and, at that point, the gettering ceases. The curves represent theoretical fits which determined the binding energy of copper atoms in the copper-silicide precipitates being dissolved, giving 1.7 eV per copper atom relative to copper in solution.

For the purpose of comparison to the copper-silicide binding energy, experiments were conducted to calculate the binding energy between the copper and the cavities. In these experiments, a cavity layer was formed and saturated with copper. Then a second, empty cavity layer was formed at a different depth. The two cavity layer system was then annealed at 650° C. or 700° C. which caused the copper to redistribute from the first to the second layer so as to equalize the fractional occupancies of the traps.

Figure 4:
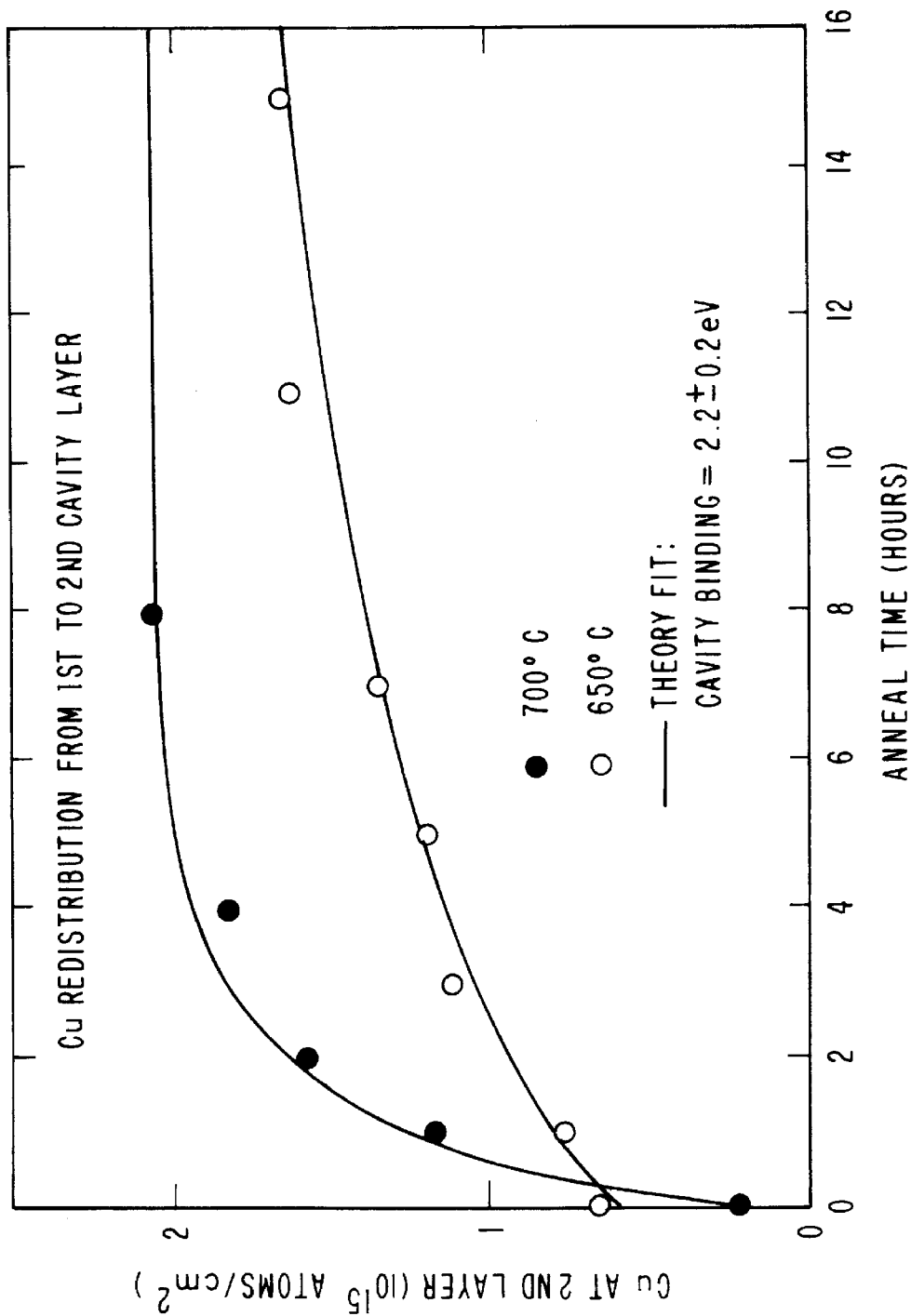
FIG. 4 is a graph showing the transfer of copper atoms from an initially fully occupied cavity layer to a second initially unoccupied cavity layer during annealing at two temperatures.

FIG. 4 shows the observed time dependence of the redistribution of the copper at the two anneal temperatures. Since this redistribution requires the copper to escape from the wall traps in the first cavity layer, the rate of redistribution provides an indication of the trap binding energy. The curves in the figure represent solutions of diffusion-trapping theory in which the trap binding energy was adjusted to produce agreement with the experimental data. This procedure yielded a binding energy of 2.2±0.2 eV relative to copper in solution in the silicon. By comparison, the binding energy of copper in precipitates of copper silicide is only 1.7 eV. This difference of about 0.5 eV in binding energy equates to a difference of several orders of magnitude in the concentration of copper impurities remaining after gettering.

Experiments similar to the above were carried out for nickel impurities, and the cavity traps were found to bind the metal atoms more strongly than precipitates of nickel silicide, paralleling the results for copper impurities.

Economic advantages to the inventive process include the ability to generate cavity gettering sites with existing semiconductor equipment technology currently available for ion implantation and diffusion furnace annealing. The subject invention also shares the flexibility for process control, and patterning capabilities inherent in ion implantation processing steps. Cavity gettering also affords the opportunity for contaminate reduction without the use of foreign dopants to achieve its effect. These features may also permit gettering to be implemented on the front, device side of wafers as well as on the back side where the gettering is presently done. This is desirable for microelectronics processing at lower temperatures and for the fabrication of devices in silicon-on-insulator wafers.

The particular processes and examples discussed above are cited merely to illustrate a particular embodiment of this invention. It is contemplated that the practice of the invention may involve additional process steps as long as the principle, the ion implantation of crystalline wafers with subsequent annealing to form gettering cavities therein, is followed. The invention contemplates other derivative process steps. It is intended that the scope of the invention be defined by the claims appended hereto.

We claim:

1. A process for gettering a substrate containing metal impurities for the manufacture of semiconductor devices comprising:

ion-implanting an inert gas into a surface of the substrate to form gettering cavities therein with wall surfaces and with dangling chemical bonds located at the wall surfaces; and annealing the ion-implanted substrate to promote migration of the metal impurities within the bulk of said substrate to said gettering cavities;

said metal impurities being trapped at the wall surfaces of the gettering cavities by means of attachment to said dangling chemical bonds, said dangling chemical bonds being highly reactive with said metal impurities resulting in the immobilization of said metal impurities.

2. The process of claim 1 wherein said substrate is a wafer having opposite planar sides, wherein said surface subjected to said ion-implantation step is on one of said sides, and wherein said substrate is selected from the group consisting of silicon, germanium, gallium arsenide, type III-V metals, type II-VI compound semiconductors, and alloys thereof.

3. The process of claim 2 wherein the inert gas is helium.

4. The process of claim 2 wherein said annealing step is carried out under vacuum conditions.

5. The process of claim 2 wherein said annealing step is carried out at a temperature within the range of about 700° C. to about 1180° C.

6. The process of claim 2 wherein said annealing step is carried out for a time period in the range of from about 30 minutes to about 1 hour.

7. The process of claim 2 wherein said ion-implantation step is carried out at an ion energy level in the range of from about 30 keV to about 300 keV.

8. The process of claim 7 wherein said ion-implantation step is carried out at a total dose within the range of from about $2\times10^{16}$ to about $1\times10^{17}$ helium atoms per square centimeter.

9. The process of claim 8 wherein said ion-implantation step is carried out at about room temperature.

10. The process of claim 8 wherein said cavities have a size within the range of from about 5 nm to about 30 nm in diameter and the total wall surface area of said cavities is about 7 square centimeters per square centimeter of wafer surface area subjected to said ion-implantation step.

11. The process of claim 7 wherein said cavities are formed within a range of from about 0.3 μm to about 1.3 μm from said surface subjected to ion-implantation.

12. The process of claim 11 wherein a layer of the crystalline material is epitaxially deposited upon said surface subsequent to said ion-implantation step.

13. The process of claim 11 wherein said substrate is backed with insulative material on the side opposite the side subjected to ion-implantation.

14. The process of claim 13 wherein said cavities are formed about 1.3 μm from said side where ion-implantation is carried out.

15. The process of claim 7 wherein said ion energy is selected from said range of from about 30 keV to about 300 keV based upon a desired distance between the surface at which ion-implantation is carried out and the location of the gettering cavities.

16. A process for preparing a gettered silicon wafer substrate for the manufacture of semiconductor devices comprising:

A. ion-implanting helium gas into a surface of said silicon wafer at an energy level in the range of at least 30 keV with a dose of at least $2\times10^{16}$ to about $1\times10^{17}$ atoms per square centimeter of surface;

B. heating said silicon wafer to a temperature of at least 700° C.; and

C. annealing said silicon wafer at the temperature reached in said heating step for a time period of at least 30 minutes;

whereby gettering cavities are formed in the bulk of said silicon wafer.

17. The process of claim 1 wherein said annealing of said ion-implanted substrate enlarges the gettering cavities.

18. The process of claim 17 wherein said inert gas permeates to said surface of said substrate leaving behind empty gettering cavities.

19. The process of claim 1 wherein said walls of said gettering cavities are populated with a sufficient density of dangling chemical bonds of said substrate operable to trap said metal impurities, said dangling chemical bonds protruding unobstructed into the interior of said gettering cavities.

* * * * *